US012334419B2

(12) United States Patent
Yamawaki et al.

(10) Patent No.: US 12,334,419 B2
(45) Date of Patent: Jun. 17, 2025

(54) LEAD FRAME AND ELECTRONIC COMPONENT

(71) Applicant: TDK CORPORATION, Tokyo (JP)

(72) Inventors: Kazuma Yamawaki, Tokyo (JP); Shuhei Miyazaki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 386 days.

(21) Appl. No.: 17/857,838

(22) Filed: Jul. 5, 2022

(65) Prior Publication Data

US 2023/0056523 A1 Feb. 23, 2023

(30) Foreign Application Priority Data

Aug. 20, 2021 (JP) .................................. 2021-134659

(51) Int. Cl.
*H01L 23/495* (2006.01)
*H01L 21/48* (2006.01)
*H01L 21/56* (2006.01)
*H01L 23/31* (2006.01)

(52) U.S. Cl.
CPC ................. *H01L 23/49548* (2013.01); *H01L 21/4842* (2013.01); *H01L 21/56* (2013.01); *H01L 23/3121* (2013.01)

(58) Field of Classification Search
CPC ......... H01L 23/49548; H01L 23/49562; H01L 23/49541; H01L 21/56
See application file for complete search history.

(56) References Cited

U.S. PATENT DOCUMENTS

| 3,702,439 | A | * | 11/1972 | McGahey | .......... G01R 1/07342 324/754.03 |
| 5,808,355 | A | * | 9/1998 | Kim | ................. H01L 23/49541 257/669 |
| 2014/0319663 | A1 | * | 10/2014 | Shibasaki | ......... H01L 23/49582 29/827 |
| 2015/0255378 | A1 | * | 9/2015 | Taguchi | ............ H01L 23/49551 257/676 |
| 2015/0270197 | A1 | | 9/2015 | Taguchi | |
| 2017/0263537 | A1 | | 9/2017 | Suzuhara | |

FOREIGN PATENT DOCUMENTS

| JP | 2010-225892 A | 10/2010 |
| JP | 2016-167532 A | 9/2016 |

\* cited by examiner

*Primary Examiner* — Walter H Swanson
*Assistant Examiner* — Jacob T Nelson
(74) *Attorney, Agent, or Firm* — Oliff PLC

(57) ABSTRACT

A lead frame includes a die pad, a plurality of leads, at least one support lead, and a frame member. The frame member includes two first connection bars and two second connection bars. The plurality of leads include a plurality of specific leads. The plurality of specific leads are each connected to the first connection bar. At least one of the specific leads is connected to the second connection bar via the at least one support lead. The cross-sectional second-order moment of a cross section of the at least one support lead perpendicular to a Y direction around an X axis is equal to or more than the cross-sectional second-order moment of a cross section of the at least one support lead perpendicular to an X direction around a Y axis.

12 Claims, 7 Drawing Sheets

1

LEAD FRAME AND ELECTRONIC COMPONENT

CROSS REFERENCE TO RELATED APPLICATIONS

This application claims the benefit of Japanese Priority Patent Application No. 2021-134659 filed on Aug. 20, 2021, the entire contents of which are incorporated herein by reference.

BACKGROUND

The technology relates to a lead frame for an electronic component and an electronic component manufactured using the lead frame.

Packages such as Dual Flatpack No-leaded (DFN) packages that are provided with no lead terminals extending outward from a package body are known as packages for electronic components, such as semiconductor devices, suitable for miniaturization. In the DFN packages, a plurality of terminals are provided on a surface of a package body. The plurality of terminals are bonded to a conductive layer on a board by soldering, for example.

In general, a lead frame, which has a die pad on which a chip is mounted and a plurality of leads, is used to manufacture the DFN package. The plurality of terminals are formed by plating parts of surfaces of the plurality of leads. In order to form good fillets when mounting an electronic component on the board, it is desirable to plate the entire surfaces of the leads that are exposed from the surface of the package body.

US 2015/0255378 A1 and JP 2016-167532 A disclose a technology for plating entire surfaces of leads exposed from a surface of a package body. US 2015/0255378 A1 describes a lead frame in which inner leads are connected to outer leads connected to a lead frame rim. The inner leads are connected to the lead frame rim through inner lead suspension leads. The outer leads have a long shape in one direction. The inner leads and inner lead suspension leads extend in a direction orthogonal to a longitudinal direction of the outer leads.

In US 2015/0255378 A1, the outer leads are cut from the lead frame rim after a semiconductor chip is encapsulated by an encapsulating resin. After the outer leads are cut, the lead frame rim and the outer leads still maintain an electrical connection relationship. In US 2015/0255378 A1, plating is applied in this state to form a plated film on entire surfaces of the outer leads exposed from the encapsulating resin.

JP 2016-167532 A describes a lead frame similar to the lead frame described in US 2015/0255378 A1. A first connection bar and a second connection bar of JP 2016-167532 A correspond to the lead frame rim of US 2015/0255378 A1. In JP 2016-167532 A, extensions are connected to leads connected to the first connection bar. The extensions are connected to the second connection bar. The leads have a long shape in one direction. The extensions extend in a direction orthogonal to a longitudinal direction of the leads.

In general, leads have a long shape in one direction. When the leads are deformed due to shocks during transportation of lead frames and the like, the characteristics of the electronic components may deteriorate.

SUMMARY

A lead frame according to an embodiment of the technology is a lead frame for an electronic component. The lead frame includes a die pad, a plurality of leads, at least one support lead, and a frame member configured to surround the die pad, the plurality of leads, and the at least one support lead. The frame member includes a first connection bar extending in a first direction and a second connection bar extending in a second direction.

The plurality of leads include a plurality of specific leads arranged along the first connection bar. The plurality of specific leads are each connected to the first connection bar. At least one of the specific leads is connected to the second connection bar via the at least one support lead. The cross-sectional second-order moment of a cross section of the at least one support lead perpendicular to the first direction around an axis parallel to the second direction is equal to or more than the cross-sectional second-order moment of a cross section of the at least one support lead perpendicular to the second direction around an axis parallel to the first direction.

In the lead frame according to the embodiment of the technology, at least one of the specific leads may be directly connected to the at least one support lead. The at least one support lead may be directly connected to the second connection bar. At least a part of the at least one support lead may be located away from the first connection bar.

In the lead frame according to the embodiment of the technology, the at least one support lead may include one support lead. The plurality of specific leads may be connected to the one support lead. In this case, the lead frame according to the embodiment of the technology may further include a connecting lead configured to connect the one support lead and the second connection bar. The one support lead may be located in a region that is to be removed in a manufacturing process of the electronic component.

In the lead frame according to the embodiment of the technology, the at least one support lead may include a plurality of support leads. Each of the specific leads may be connected to the second connection bar via a corresponding one of the support leads.

In the lead frame according to the embodiment of the technology, the at least one support lead may have a first dimension in the first direction and a second dimension in the second direction. The second dimension may be equal to or more than the first dimension.

In the lead frame according to the embodiment of the technology, the shape of the at least one support lead, when viewed from a third direction orthogonal to the first and second directions, may be an n-sided polygon where n is 4 or more, a circle, or an ellipse.

An electronic component according to an embodiment of the technology is an electronic component manufactured using the lead frame according to the embodiment of the technology. The electronic component includes a chip mounted on the die pad, and an encapsulating resin that encapsulates the die pad, the plurality of leads, and the chip. Each of the leads has an exposed surface that is not covered with the encapsulating resin.

The electronic component according to the embodiment of the technology may further include a plating layer configured to cover the exposed surface.

In the lead frame and the electronic component according to the embodiment of the technology, the cross-sectional second-order moment of the cross section of the at least one support lead perpendicular to the first direction around the axis parallel to the second direction is equal to or more than the cross-sectional second-order moment of the cross section of the at least one support lead perpendicular to the second direction around the axis parallel to the first direction.

Therefore, according to the embodiment of the technology, it is possible to suppress deformation of the leads.

Other and further objects, features and advantages of the technology will become appear more fully from the following description.

BRIEF DESCRIPTION OF THE DRAWINGS

The accompanying drawings are included to provide a further understanding of the disclosure and are incorporated in and constitute a part of this specification. The drawings illustrate example embodiments and, together with the specification, serve to explain the principles of the technology.

DETAILED DESCRIPTION

Figure 1:
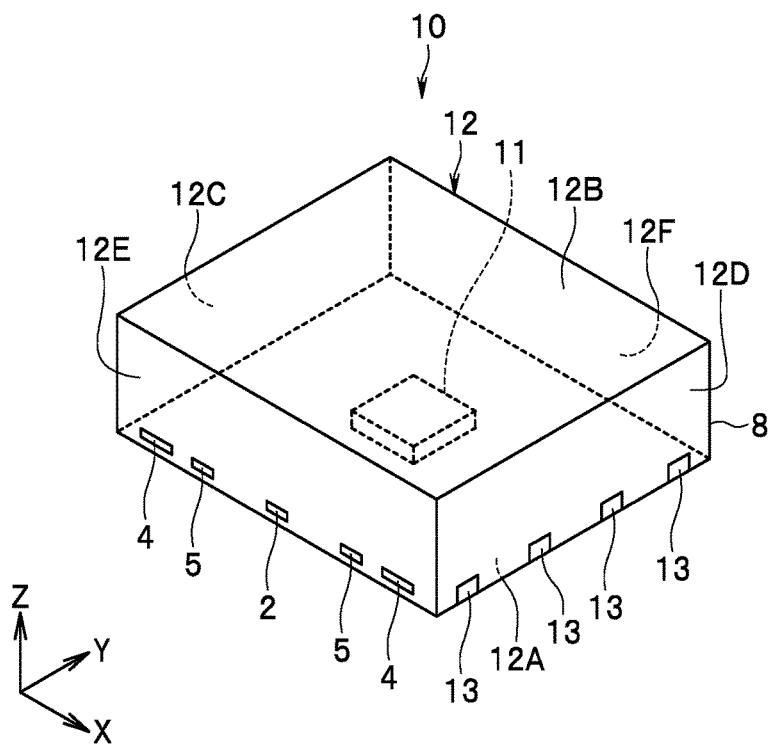
FIG. 1 is a perspective view of an electronic component according to a first example embodiment of the technology.

The purpose of the technology is to provide a lead frame that enables the suppression of the deformation of leads, and an electronic component using the lead frame.

In the following, some example embodiments and modification examples of the technology are described in detail with reference to the accompanying drawings. Note that the following description is directed to illustrative examples of the disclosure and not to be construed as limiting the technology. Factors including, without limitation, numerical values, shapes, materials, components, positions of the components, and how the components are coupled to each other are illustrative only and not to be construed as limiting the technology. Further, elements in the following example embodiments which are not recited in a most-generic independent claim of the disclosure are optional and may be provided on an as-needed basis. The drawings are schematic and are not intended to be drawn to scale. Like elements are denoted with the same reference numerals to avoid redundant descriptions. Note that the description is given in the following order.

First Example Embodiment

Figure 2:
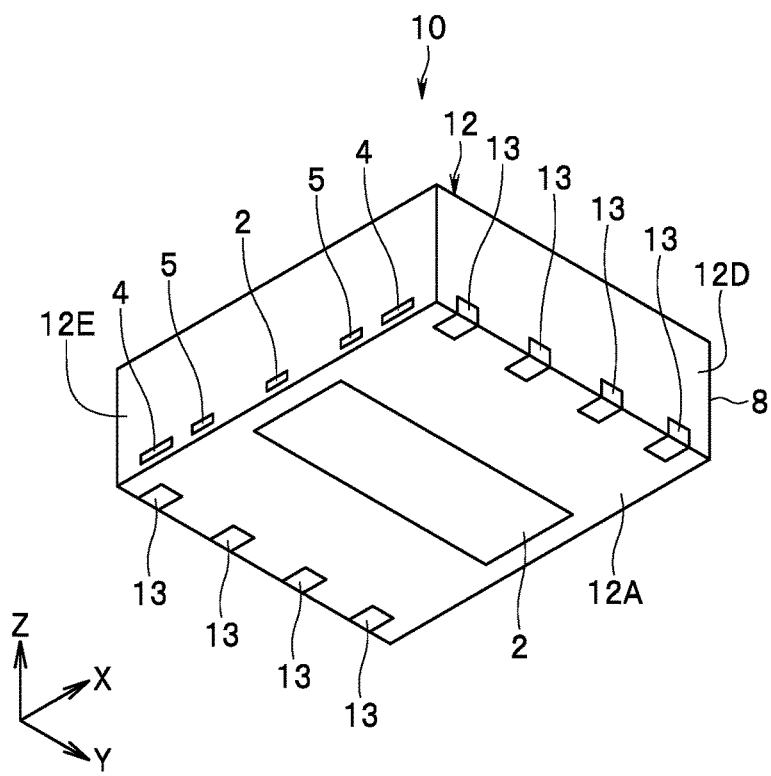
FIG. 2 is a perspective view of the electronic component according to the first example embodiment of the technology.
Figure 3:
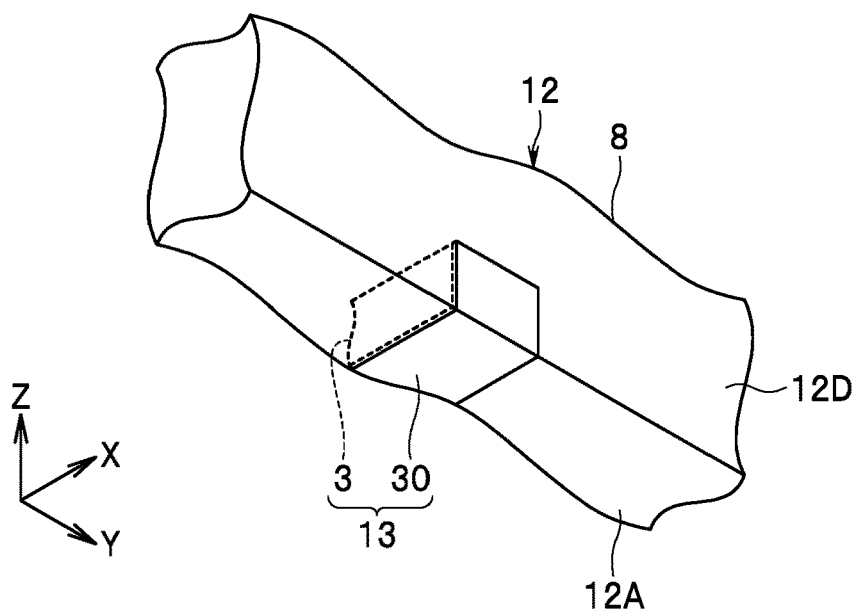
FIG. 3 is an enlarged perspective view of a part of the electronic component illustrated in FIG. 2.

Example embodiments of the technology will now be described in detail with reference to the drawings. First, with reference to FIGS. 1 to 3, an electronic component according to a first example embodiment of the technology will be described. FIGS. 1 and 2 are perspective views of the electronic component. FIG. 3 is an enlarged perspective view of a part of the electronic component illustrated in FIG. 2.

An electronic component 10 according to the example embodiment is an electronic component manufactured using a lead frame according to the example embodiment. The electronic component 10 includes a chip 11, an encapsulating resin 8, and a plurality of terminals 13. The chip 11 is mounted on a die pad 2 of the lead frame. The chip 11 has a plurality of electrode pads. The plurality of electrode pads are connected to a plurality of leads 3 of the lead frame by a plurality of bonding wires not-shown. The encapsulating resin 8 encapsulates the die pad 2, the plurality of leads 3, and the chip 11. The encapsulating resin 8 constitutes a large portion of a package body (hereinafter simply referred to as a body) 12 of the electronic component 10.

In particular, in the example embodiment, the body 12 is approximately in the shape of a rectangular parallelepiped. The body 12 has a bottom surface 12A, a top surface 12B, and four side surfaces 12C to 12F, which constitute an outer periphery of the body 12. The bottom surface 12A and the top surface 12B are opposite to each other. The side surfaces 12C and 12D are opposite to each other. The side surfaces 12E and 12F are opposite to each other. The side surfaces 12C to 12F are perpendicular to the bottom surface 12A and the top surface 12B. FIG. 1 illustrates the electronic component 10 viewed from the side of the top surface 12B. FIG. 2 illustrates the electronic component 10 viewed from the side of the bottom surface 12A.

Here, X, Y, and Z directions are defined as shown in FIGS. 1 to 3. The X, Y, and Z directions are orthogonal to one another. In the example embodiment, the Z direction refers to a direction that is perpendicular to the bottom surface 12A and that is pointing to the top surface 12B from the bottom surface 12A. The opposite directions to the X, Y, and Z directions are defined as −X, −Y, and −Z directions, respectively.

In the example embodiment, the Y direction corresponds to a "first direction" in the technology. The X direction corresponds to a "second direction" in the technology. The Z direction corresponds to a "third direction" in the technology. The first direction, the second direction, and the third direction may be orthogonal to each other.

As illustrated in FIGS. 1 and 2, the bottom surface 12A is located at an end of the body 12 in a −Z direction. The top surface 12B is located at an end of the body 12 in the Z direction. The side surface 12C is located at an end of the body 12 in a −X direction. The side surface 12D is located at an end of the body 12 in the X direction. The side surface 12E is located at an end of the body 12 in a −Y direction. The side surface 12F is located at an end of the body 12 in the Y direction.

Some of the terminals 13 are arranged on and near a ridge line between the bottom surface 12A and the side surface 12C. In the example illustrated in FIGS. 1 and 2, four terminals 13 aligned in the Y direction are arranged on and near the ridge line between the bottom surface 12A and the side surface 12C. Similarly, some of the other terminals of the plurality of terminals 13 are arranged on and near a ridge line between the bottom surface 12A and the side surface 12D. In the example illustrated in FIGS. 1 and 2, four terminals 13 aligned in the Y direction are arranged on and near the ridge line between the bottom surface 12A and the side surface 12D.

As illustrated in FIG. 3, each of the leads 3 has an exposed surface that is not covered with the encapsulating resin 8. The electronic component 10 further includes a plurality of plating layers 30 that cover the exposed surfaces of the plurality of leads 3, respectively. Each of the terminals 13 is constituted of the lead 3 and the plating layer 30.

The die pad 2 has an exposed surface that is not covered with the encapsulating resin 8. Most of the exposed surface of the die pad 2 is located on the bottom surface 12A. The electronic component 10 further has a not-shown plating layer, which covers a portion of the exposed surface of the die pad 2 that is located on the bottom surface 12A.

The portions of the exposed surface of the die pad 2, which are not disposed on the bottom surface 12A, are arranged on the side surfaces 12E and 12F. The portions of the exposed surface of the die pad 2 that are arranged on the side surfaces 12E and 12F may or may not be covered with the plating layer.

The electronic component 10 is mounted on a mounting board with the bottom surface 12A of the body 12 facing the mounting board. The electronic component 10 illustrated in FIGS. 1 to 3 is a Dual Flatpack No-leaded (DFN) package having no lead terminals extending outward from the body 12.

Figure 4:
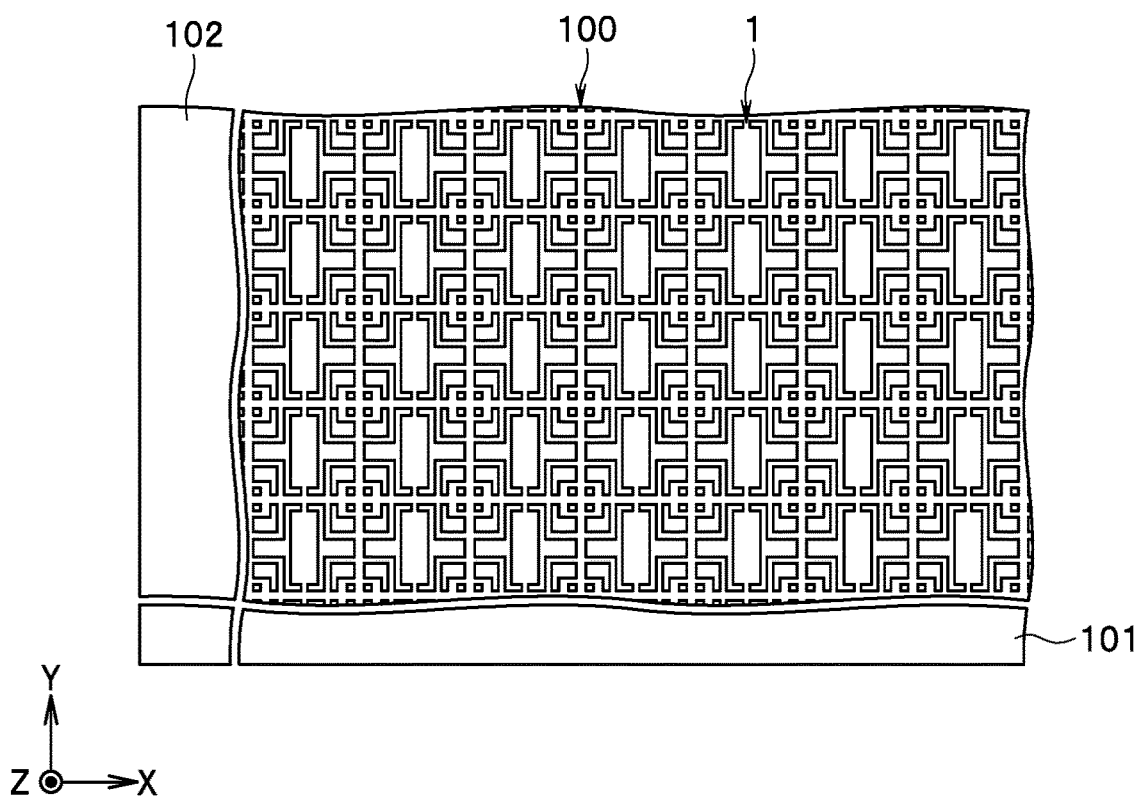
FIG. 4 is a plan view of a lead frame structure in the first example embodiment of the technology.
Figure 5:
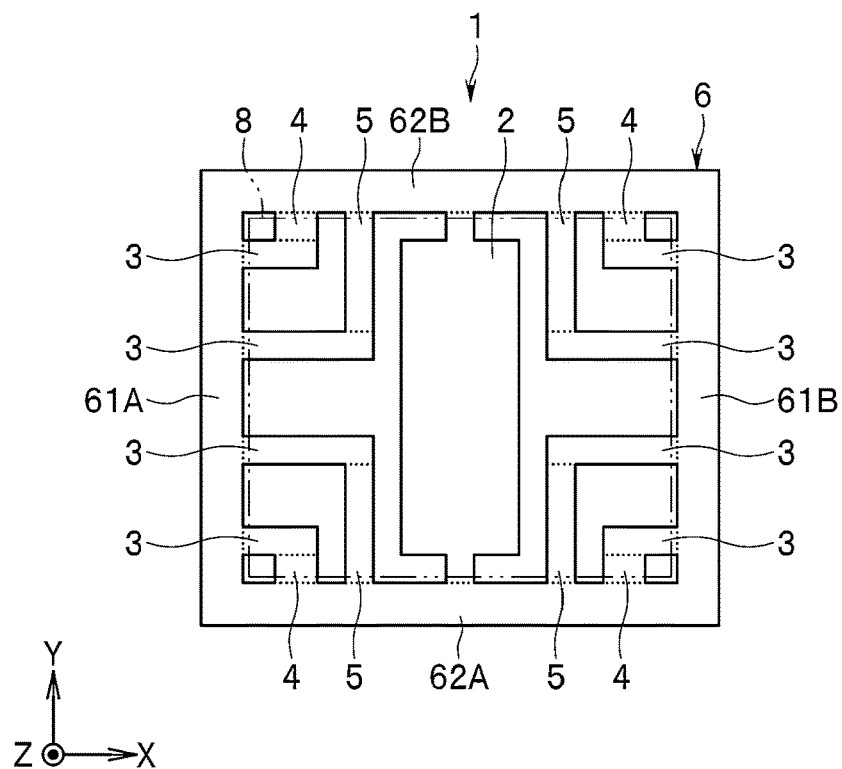
FIG. 5 is a plan view of a lead frame according to the first example embodiment of the technology.
Figure 6:
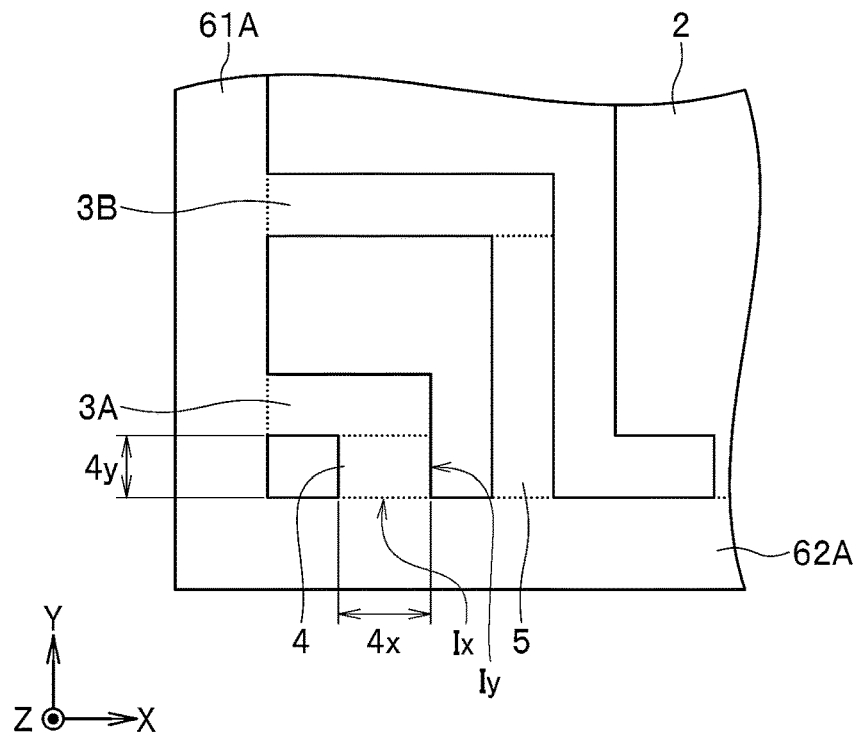
FIG. 6 is an enlarged plan view of a part of the lead frame illustrated in FIG. 5.

Next, the lead frame according to the example embodiment will be described with reference to FIGS. 4 to 6. FIG. 4 is a plan view of a lead frame structure in the example embodiment. FIG. 5 is a plan view of a lead frame according to the example embodiment. FIG. 6 is an enlarged plan view of a part of the lead frame illustrated in FIG. 5. In FIGS. 4 to 6, the X, Y, and Z directions are illustrated as in FIGS. 1 to 3. In FIGS. 4 to 6, the X, Y and Z directions are defined such that the relationship between the orientation of die pad 2 and the X, Y, and Z directions is the same as in FIGS. 1 to 3.

A lead frame structure 100 illustrated in FIG. 4 includes a plurality of lead frames 1 for the electronic components 10. In the example illustrated in FIG. 4, the plurality of lead frames 1 are arranged such that multiple lead frames 1 align with one another in the X and Y directions, respectively. The lead frame structure 100 is made by processing a metal plate made of an alloy containing Cu or Fe, for example.

The structure of the lead frames 1 will be described below, focusing on one lead frame 1. The lead frame 1 includes the die pad 2, the plurality of leads 3, at least one support lead 4, and a frame member 6 surrounding the die pad 2, the plurality of leads 3, and the at least one support lead 4.

The frame member 6 includes two first connection bars 61A and 61B each extending in the Y direction, and two second connection bars 62A and 62B each extending in the X direction. One end of the first connection bar 61A is connected to one end of the second connection bar 62A. The other end of the second connection bar 62A is connected to one end of the first connection bar 61B. The other end of the first connection bar 61B is connected to one end of the second connection bar 62B. The other end of the second connection bar 62B is connected to the other end of the first connection bar 61A.

One end of the die pad 2 is connected to the second connection bar 62A. The other end of the die pad 2 is connected to the second connection bar 62B. In FIG. 5, a boundary between the die pad 2 and the second connection bar 62A, and a boundary between the die pad 2 and the second connection bar 62B are indicated by dotted lines.

The lead frame 1 has eight leads 3 serving as the plurality of leads 3. Each of the eight leads 3 extends in the X direction. Four of the leads 3 are arranged between the die pad 2 and the first connection bar 61A so as to be aligned along the first connection bar 61A. The four leads 3 are each connected to the first connection bar 61A. In FIG. 5, boundaries between each of the four leads 3 and the first connection bar 61A are indicated by a dotted line.

The other four leads 3 are arranged between the die pad 2 and the first connection bar 61B so as to be aligned along the first connection bar 61B. The other four leads 3 are each connected to the first connection bar 61B. In FIG. 5, boundaries between each of the other four leads 3 and the first connection bar 61B are indicated by a dotted line.

The lead frame 1 includes four support leads 4 serving as the at least one support lead 4. The lead frame 1 further includes four connecting leads 5.

Here, of the four leads 3 arranged along the first connection bar 61A, the lead 3 located at an end in the —Y direction is referred to as a specific lead 3A, and the lead 3 adjacent to the specific lead 3A is referred to as a specific lead 3B. FIG. 6 illustrates the specific leads 3A and 3B.

At least one of the specific leads 3A or 3B is connected to the second connection bar 62A via the at least one support lead 4. In the example embodiment, the specific lead 3A is connected to the second connection bar 62A via the support lead 4. The specific lead 3B is connected to the second connection bar 62A via the connecting lead 5.

In the example embodiment, the specific lead 3A is directly connected to the support lead 4. The support lead 4 is directly connected to the second connection bar 62A. At least a part of the support lead 4 is located away from the first connection bar 61A. In the example illustrated in FIGS. 5 and 6, the support lead 4 is located away from the first connection bar 61A in its entirety.

With replacement of the second connection bar 62A with the second connection bar 62B, the foregoing description of the specific leads 3A and 3B also applies to, of the four leads 3 arranged along the first connection bar 61A, the lead 3 located at an end in the Y direction and the lead 3 adjacent to this lead 3 at the end. In this case, the lead 3 located at the end in the Y direction corresponds to the specific lead 3A, and the lead 3 adjacent to this lead 3 corresponds to the specific lead 3B. Similarly, with replacement of the first connection bar 61A with the first connection bar 61B, the foregoing description of the four leads 3 arranged along the first connection bar 61A also applies to the four leads 3 arranged along the first connection bar 61B.

In FIGS. 5 and 6, a boundary between the lead 3 (specific lead 3A) and the support lead 4, a boundary between the lead 3 (specific lead 3B) and the connecting lead 5, a boundary between the support lead 4 and the second connection bar 62A or 62B, and a boundary between the connecting lead 5 and the second connection bar 62A or 62B are indicated by dotted lines.

In FIG. 5, an area enclosed by a dashed double-dotted rectangle with the reference numeral 8 indicates an area encapsulated by the encapsulating resin 8 in the electronic component 10 manufactured using the lead frame 1. An area outside the dashed double-dotted rectangle with the reference numeral 8 is an area that is to be removed in a manufacturing process of the electronic component 10. The first connection bars 61A and 61B and the second connection bars 62A and 62B are located in the area to be removed in the manufacturing process of electronic component 10. In the manufacturing process of the electronic component 10, the leads 3 are also removed at a portion in the vicinity of the boundary between the lead 3 and the first connection bar 61A or 61B.

In the manufacturing process of the electronic component 10, the die pad 2 is also removed at a portion in the vicinity of the boundary between the die pad 2 and the second connection bar 62A and at a portion in the vicinity of the boundary between the die pad 2 and the second connection bar 62B; the support leads 4 are also removed at a portion in the vicinity of the boundary between the support lead 4 and the second connection bar 62A or 62B; and the connecting leads 5 are also removed at a portion in the vicinity of the boundary between the connecting lead 5 and the second connection bar 62A or 62B. As a result, as illustrated in FIGS. 1 and 2, end surfaces of the die pad 2, the support leads 4, and the connecting leads 5 are exposed from the side surfaces 12E and 12F of the body 12 of the electronic component 10.

So far, focus has been placed on the describing of the single lead frame 1. As described above, the lead frame structure 100 in the example embodiment includes the plurality of lead frames 1. The lead frame structure 100 also includes a plurality of first connection bars 61A, a plurality of first connection bars 61B, a plurality of second connection bars 62A, and a plurality of second connection bars 62B.

The plurality of first connection bars 61A and the plurality of first connection bars 61B are arranged in the X direction such that the first connection bars 61A and the first connection bars 61B are alternately disposed. Each of the first connection bars 61A and 61B has, in a direction parallel to the Y direction, a dimension corresponding to the plurality of lead frames 1 aligned in the Y direction.

The plurality of second connection bars 62A and the plurality of second connection bars 62B are arranged in the Y direction, such that the second connection bars 62A and the second connection bars 62B are alternately disposed and cross the plurality of first connection bars 61A and 61B. Each of the second connection bars 62A and 62B has, in a direction parallel to the X direction, a dimension corresponding to the plurality of lead frames 1 aligned in the X direction.

The lead frame structure 100 includes a third connection bar 101 located at an end of the lead frame structure 100 in the —Y direction, a not-shown fourth connection bar located at an end of the lead frame structure 100 in the Y direction, a fifth connection bar 102 located at an end of the lead frame structure 100 in the —X direction, and a not-shown sixth connection bar located at an end of the lead frame structure 100 in the X direction. The plurality of first connection bars 61A and the plurality of first connection bars 61B are each connected to the third connection bar 101 and the fourth connection bar. The plurality of second connection bars 62A and the plurality of second connection bars 62B are each connected to the fifth connection bar 102 and the sixth connection bar.

Next, the shape of the support lead 4 will be described in detail with reference to FIG. 6. The support lead 4 has a shape that is relatively difficult to bend around an axis parallel to the X direction (hereinafter referred to as an X axis). Here, Ix represents the cross-sectional second-order moment of the cross section of the support lead 4 perpendicular to the Y direction around the X axis. Iy represents the cross-sectional second-order moment of the cross section of the support lead 4 perpendicular to the X direction around an axis parallel to the Y direction (hereinafter referred to as a Y axis). In the example embodiment, the cross-sectional second-order moment Ix is equal to or more than the cross-sectional second-order moment Iy. The cross-sectional second-order moment may be cross-sectional second-order moment around an axis passing through a figure center of a cross section.

The cross-sectional second-order moment is a parameter that expresses difficulty of bending. As the cross-sectional second-order moment Ix increases, the support lead 4 is less likely to bend around the X axis. In the example embodiment, by making the cross-sectional second-order moment Ix equal to or more than the cross-sectional second-order moment Ty, the support lead 4 is less likely to bend around the X axis than when the cross-sectional second-order moment Ix is less than the cross-sectional second-order moment Ty.

In the example embodiment, the shape of the support lead 4 when viewed from the Z direction is quadrangular. Two sides of this quadrangle are parallel to the X direction, and the other two sides of this quadrangle are parallel to the Y direction. The shape when viewed from the Z direction is referred to as a planar shape.

The support lead 4 has a first dimension $4y$ in the Y direction and a second dimension $4x$ in the X direction. The second dimension $4x$ may be equal to or more than the first dimension $4y$. When the second dimension $4x$ is equal to the first dimension $4y$, the planar shape of the support lead 4 is square. When the second dimension $4x$ is more than the first dimension $4y$, the planar shape of the support lead 4 is rectangular.

Provided that the cross-sectional shape of the support lead 4 is rectangular and the thickness (dimension in the Z direction) of the support lead 4 is constant, when the second dimension $4x$ is equal to or more than the first dimension $4y$, the cross-sectional second-order moment Ix is equal to or more than the cross-sectional second-order moment Ty.

Next, a manufacturing method of the electronic component 10 will be described with reference to FIGS. 4 to 6. In the manufacturing method of the electronic component 10, first, the chips 11 are mounted on the die pads 2 of the lead frames 1. Next, the plurality of electrode pads of each chip 11 are connected to the plurality of leads 3 of each lead frame 1 by bonding wires. Next, an encapsulating process is performed in which the die pads 2, the plurality of leads 3, and the chips 11 are encapsulated with the encapsulating resin 8. In the encapsulating process, the first connection bars 61A and 61B and the second connection bars 62A and 62B of the frame members 6 of the lead frames 1 are also encapsulated. Hereafter, a structure produced in the encapsulating process, which includes the lead frames 1 and the encapsulating resin 8, is referred to as a basic structure.

In the basic structure, each of the leads 3 may be exposed from the encapsulating resin 8 at a portion that is in the vicinity of the first connection bar 61A or 61B. In the basic structure, a part of the die pad 2 may be exposed from the encapsulating resin 8. The lead frame 1 may have a structure such that a part of each of the leads 3 and a part of the die pad 2 are exposed, as described above. Alternatively, prior to the encapsulating process, the lead frame 1 may be processed such that a part of each of the leads 3 and a part of the die pad 2 are exposed, as described above.

In the manufacturing method of the electronic component 10, the basic structure is then secured to a not-shown dicing tape. Next, a cutting process is performed in which the basic structure is cut by a dicing saw such that the first connection bars 61A and 61B are removed. By the cutting process, cut surfaces of the plurality of leads 3 are exposed from the encapsulating resin 8. In the cutting process, the basic structure may be cut such that the basic structure is not divided, in other words, such that the third connection bar 101 and the fourth connection bar are not completely cut off. The plurality of leads 3 are connected to the second connection bar 62A or 62B via the support lead 4 or the connecting lead 5. The second connection bars 62A and 62B are connected to the fifth connection bar 102 and the sixth connection bar.

In the manufacturing method of the electronic component 10, the plating layer 30 is then formed on surfaces of the plurality of leads 3 exposed from the encapsulating resin 8, as well as on a surface of the die pad 2 exposed from the encapsulating resin 8 by electroplating, for example. When using the electroplating, the plating layer can be formed by connecting an electrode of an electroplating device to at least one of the third connection bar 101, the not-shown fourth connection bar, the fifth connection bar 102, and the not-shown sixth connection bar.

In the manufacturing method of the electronic component 10, next, the plurality of electronic components 10 are divided from one another by cutting the basic structure such that the second connection bars 62A and 62B are removed. Thereby, the electronic component 10 is completed.

Next, the actions and effects of the lead frame 1 and electronic component 10 according to the example embodiment will be described. The plurality of leads 3 each extend from the first connection bar 61A or 61B in a direction parallel to the X direction. Therefore, the plurality of leads 3 tend to bend around the Y axis. Here, it is assumed that each of the leads 3 is connected to the second connection bar 62A or 62B through the connecting lead. In this case, the plurality of connecting leads each extend from the second connection bar 62A or 62B in a direction parallel to the Y direction. Therefore, the plurality of connecting leads tend to bend around the X axis.

In contrast, in the example embodiment, four of the leads 3 are each connected to the support lead 4. As described above, the support lead 4 has a shape that is relatively difficult to bend around the X axis. Therefore, when compared with the same length in the Y direction, the amount of deflection of the support lead 4 in the vicinity of an end on the side of the lead 3 caused by bending of the support lead 4 around the X axis is smaller than the amount of deflection of the connecting lead in the vicinity of an end on the side of the lead 3 caused by bending of the connecting lead around the X axis. Therefore, according to the example embodiment, it is possible to suppress deformation of the lead 3 connected to the support lead 4.

Also, according to the example embodiment, for example by using the lead 3, which is connected to the support lead 4, as a part of a signal line that is more susceptible to deformations of the lead 3, it is possible to suppress changes in the characteristics of the electronic component 10 caused by the deformation of the lead 3.

Modification Examples

Figure 7:
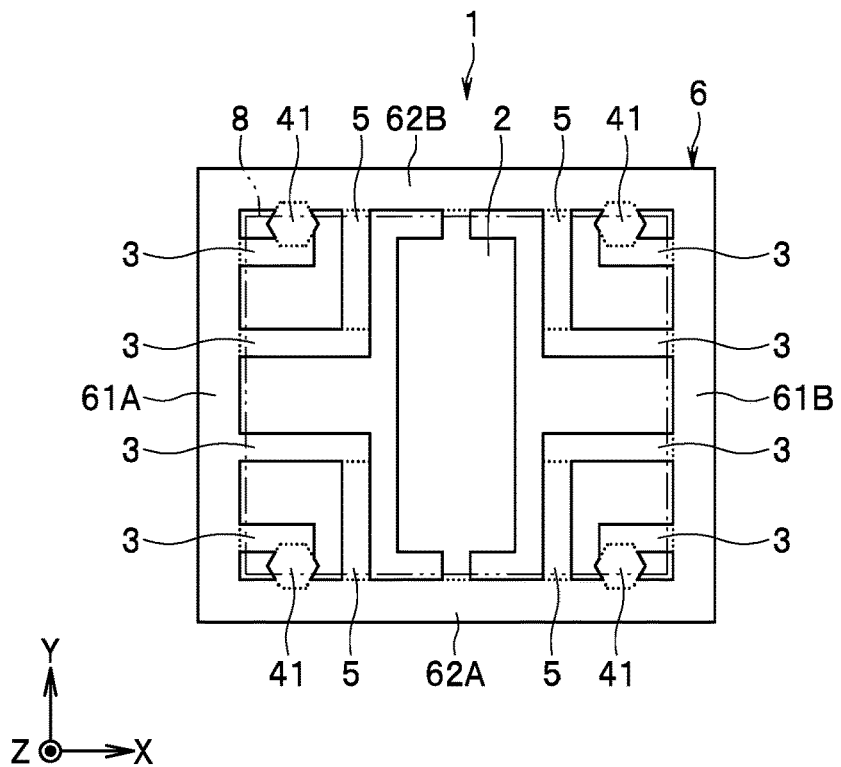
FIG. 7 is a plan view of a first modification example of the lead frame according to the first example embodiment of the technology.

Next, first to fourth modification examples of the lead frame 1 according to the example embodiment will be described. First, the first modification example of the lead frame 1 will be described with reference to FIG. 7. In the first modification example, the lead frame 1 includes four support leads 41, instead of the four support leads 4 illustrated in FIGS. 5 and 6. In FIG. 7, boundaries between the lead 3 and the support lead 41, and boundaries between the support lead 41 and the second connection bar 62A or between the support lead 41 and the second connection bar 62B are indicated by dotted lines. The planar shape of the support lead 41 is polygonal. In the example illustrated in FIG. 7 in particular, the planar shape of the support lead 41 is hexagonal. The support leads 41 are arranged in such an orientation that the cross-sectional second-order moment Ix is equal to or more than the cross-sectional second-order moment Iy. When the planar shape of the support lead is polygonal, the planar shape is not limited to square or hexagonal, but can be an n-sided polygon where n is 4 or more.

Figure 8:
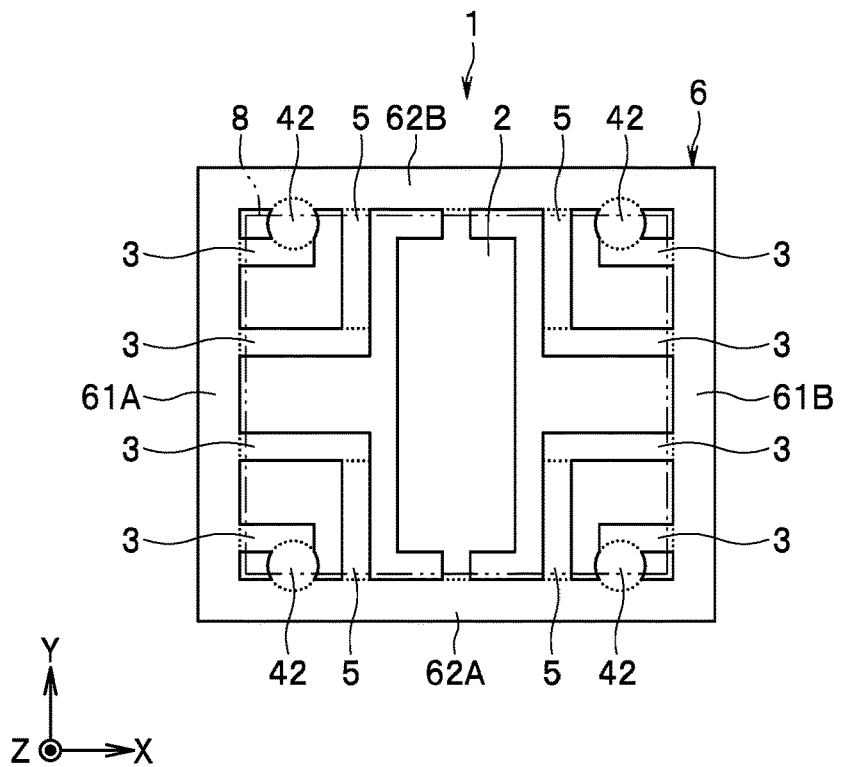
FIG. 8 is a plan view of a second modification example of the lead frame according to the first example embodiment of the technology.

Next, the second modification example of the lead frame 1 will be described with reference to FIG. 8. In the second modification example, the lead frame 1 includes four support leads 42, instead of the four support leads 4 illustrated in FIGS. 5 and 6. In FIG. 8, boundaries between the lead 3 and the support lead 42, and boundaries between the support lead 42 and the second connection bar 62A or between the support lead 42 and the second connection bar 62B are indicated by dotted lines. The planar shape of the support lead 42 is a circle.

Figure 9:
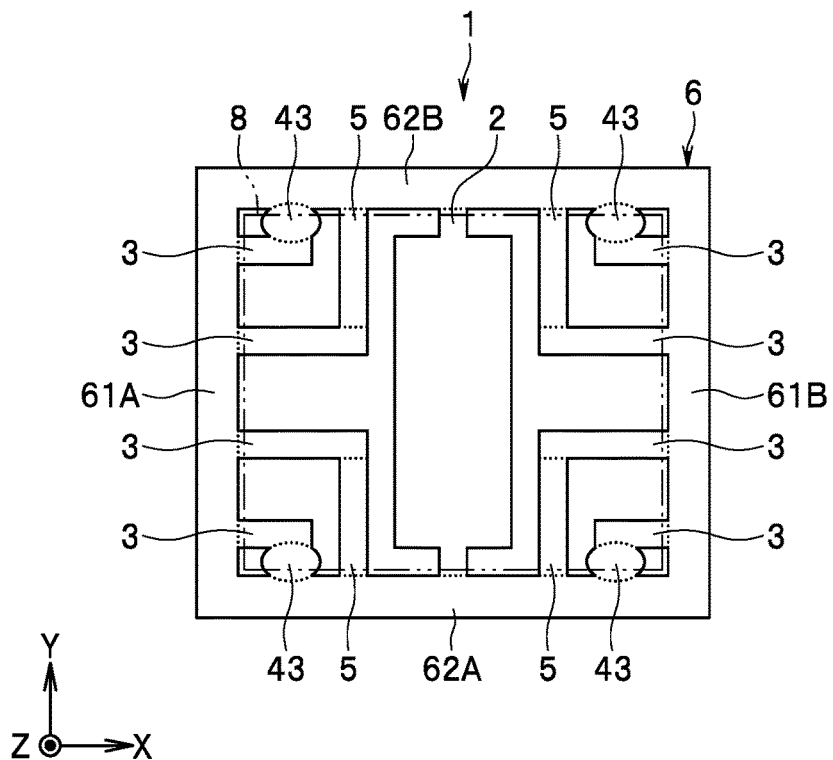
FIG. 9 is a plan view of a third modification example of the lead frame according to the first example embodiment of the technology.

Next, the third modification example of the lead frame 1 will be described with reference to FIG. 9. In the third modification example, the lead frame 1 includes four support leads 43, instead of the four support leads 4 illustrated in FIGS. 5 and 6. In FIG. 9, boundaries between the lead 3 and the support lead 43, and boundaries between the support lead 43 and the second connection bar 62A or between the support lead 43 and the second connection bar 62B are indicated by dotted lines. The planar shape of the support lead 43 is an ellipse. The support leads 43 are arranged in such an orientation that the cross-sectional second-order moment Ix is more than the cross-sectional second-order moment Iy.

Figure 10:
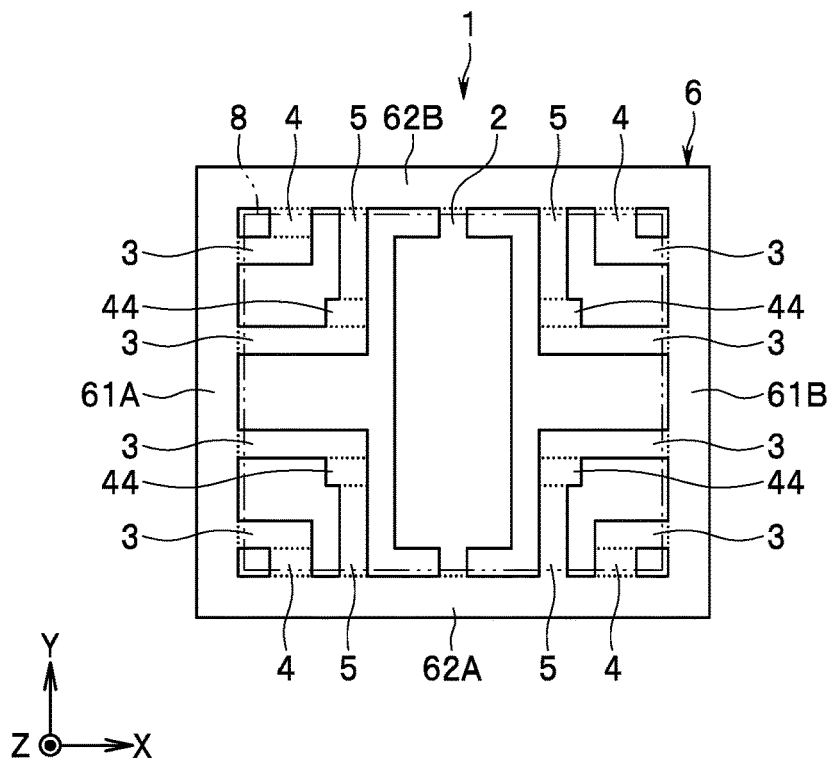
FIG. 10 is a plan view of a fourth modification example of the lead frame according to the first example embodiment of the technology.

Next, the fourth modification example of the lead frame 1 will be described with reference to FIG. 10. In the fourth modification example, the lead frame 1 includes four support leads 44, in addition to the four support leads 4. The planar shape of each of the four support leads 44 is the same as the planar shape of the support lead 4. Each of the four support leads 44 is interposed between the lead 3 and the connecting lead 5 to which the support lead 4 is not connected. In other words, in the fourth modification example, four of the eight leads 3 are each connected to the second connection bar 62A or 62B via the support lead 4. The other four of the eight leads 3 are each connected to the second connection bar 62A or 62B via the support lead 44 and the connecting lead 5. In FIG. 10, boundaries between the lead 3 and the support lead 44 and boundaries between the support lead 44 and connecting lead 5 are indicated by dotted lines.

Second Example Embodiment

Figure 11:
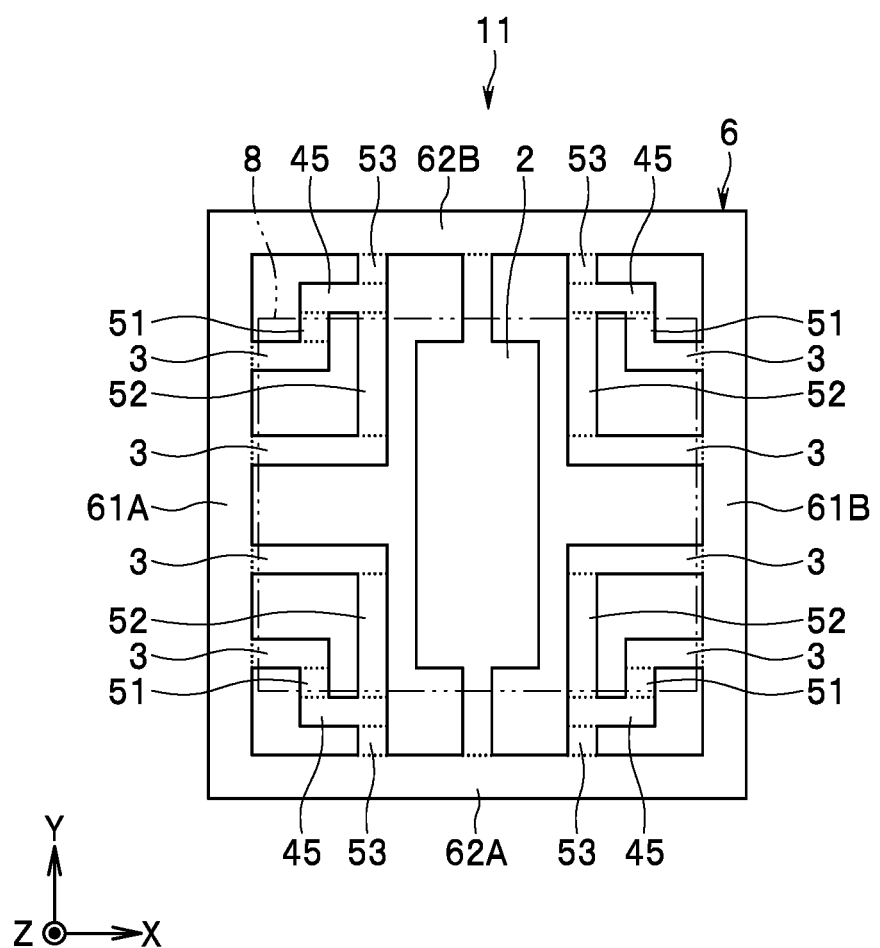
FIG. 11 is a plan view of a lead frame according to a second example embodiment of the technology.
Figure 12:
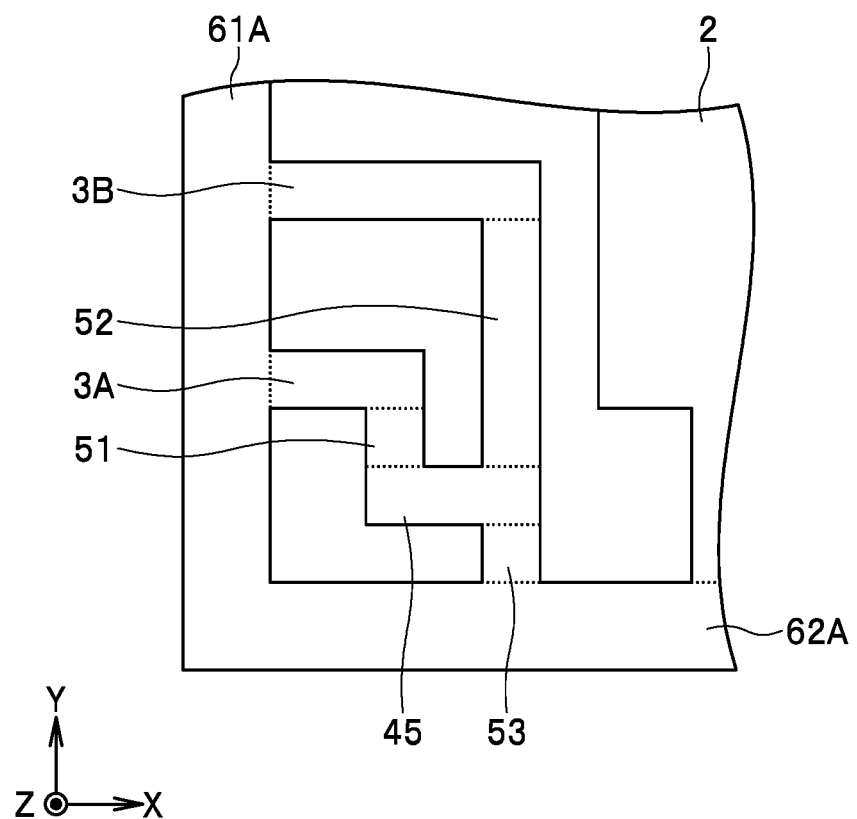
FIG. 12 is an enlarged plan view of a part of the lead frame illustrated in FIG. 11.

A second example embodiment of the technology will now be described with reference to FIGS. 11 and 12. FIG. 11 is a plan view of a lead frame according to the example embodiment. FIG. 12 is an enlarged plan view of a part of the lead frame illustrated in FIG. 11.

A lead frame 1 according to the example embodiment has four support leads 45, instead of the eight support leads 4 according to the first example embodiment. The lead frame 1 also includes four connecting leads 51, four connecting leads 52, and four connecting leads 53, instead of the four connecting leads 5 according to the first example embodiment. The support leads 45 have a shape that is relatively difficult to bend around the X axis, as in the support leads 4. The cross-sectional second-order moment of the cross section of the support lead 45 perpendicular to the Y direction around the X axis is equal to or more than the cross-sectional second-order moment of the cross section of the support lead 45 perpendicular to the X direction around the Y axis. The planar shape of each of the four support leads 45 may be the same as the planar shape of the support leads 4 in the first example embodiment.

FIG. 12 illustrates the specific leads 3A and 3B described in the first example embodiment. The specific leads 3A and 3B are connected to the single support lead 45. The specific lead 3A is connected to the support lead 45 via the connecting lead 51. The specific lead 3B is connected to the support lead 45 via the connecting lead 52. The support lead 45 is connected to the second connection bar 62A via the connecting lead 53. The support lead 45 to which the specific leads 3A and 3B are connected is located away from the first connection bar 61A in its entirety. The dimension of the connecting lead 53 in the X direction is smaller than the dimension of the support lead 45 in the X direction.

The foregoing description of the specific leads 3A and 3B also applies to, of the four leads 3 arranged along the first connection bar 61A, the lead 3 located at an end in the Y direction and the lead 3 adjacent to this lead 3, with replacement of the second connection bar 62A with the second connection bar 62B. In this case, the lead 3 located at the end in the Y direction corresponds to the specific lead 3A, and the lead 3 adjacent to this lead 3 corresponds to the specific lead 3B. Similarly, the foregoing description of the four leads 3 arranged along the first connection bar 61A also applies to the four leads 3 arranged along the first connection bar 61B, with replacement of the first connection bar 61A with the first connection bar 61B.

In FIGS. 11 and 12, boundaries between the lead 3 and the connecting lead 51 or 52, boundaries between the connecting lead 51 or 52 and the support lead 45, boundaries between the support lead 45 and the connecting lead 53, and boundaries between the connecting lead 53 and the second connection bar 62A or 62B are indicated by dotted lines.

In FIG. 11, an area enclosed by a dashed double-dotted rectangle with the reference numeral 8 indicates an area encapsulated by the encapsulating resin 8 in the electronic component 10 manufactured using the lead frame 1 according to the example embodiment. An area outside the dashed double-dotted rectangle with the reference numeral 8 is an area that is to be removed in the manufacturing process of the electronic component 10. The first connection bars 61A and 61B, the second connection bars 62A and 62B, the support leads 45, and the connecting leads 53 are located in a region to be removed in the manufacturing process of the electronic component 10. In the manufacturing process of the electronic component 10, the connecting leads 51 and 52 are removed at a portion in the vicinity of the boundary between the connecting lead 51 or 52 and the support lead 45.

Next, the manufacturing method of the electronic component 10 according to the example embodiment will be described. The manufacturing method of the electronic component 10 according to the example embodiment is the same as that according to the first example embodiment, up to the process of forming the plating layer 30 on the surfaces of the plurality of leads 3 exposed from the encapsulating resin 8, as well as on the surface of the die pad 2 exposed from the encapsulating resin 8. In the example embodiment, the plurality of electronic components 10 are divided from one another by cutting the basic structure such that the second connection bars 62A and 62B, the support leads 45, and the connecting leads 53 are removed. Thereby, the electronic component 10 is completed.

In the example embodiment, at least one of the connecting leads 51 and 53 may not be provided. When the connecting lead 51 is not provided, the lead 3 (specific lead 3A) is directly connected to the support lead 45. When the connecting lead 53 is not provided, the support lead 45 is directly connected to the second connection bar 62A or 62B.

In the example embodiment, the planar shape of each of the four support leads 45 may be the same as the planar shape of any of the support lead 41 illustrated in FIG. 7, the support lead 42 illustrated in FIG. 8, and the support lead 43 illustrated in FIG. 9. The configuration, operation and effects of the present example embodiment are otherwise the same as those of the first example embodiment.

The technology is not limited to the foregoing example embodiments, and various modifications may be made thereto. For example, the shape, number, and layout of each of the leads, support leads, and connecting leads are not limited to the examples described in each example embodiment, but are arbitrary, as long as they meet requirements of the claims. The planar shape of the support leads may be a rounded polygon, a part of a circle, a part of an ellipse, or any other shape.

Obviously, many modifications and variations of the technology are possible in the light of the above teachings. Thus, it is to be understood that, within the scope of the appended claims and equivalents thereof, the technology may be practiced in other embodiments than the foregoing example embodiments.

What is claimed is:

1. A lead frame for an electronic component, comprising:
a die pad;
a plurality of leads;
at least one support lead; and
a frame member configured to surround the die pad, the plurality of leads, and the at least one support lead, wherein:
the frame member includes a first connection bar extending in a first direction and a second connection bar extending in a second direction;
the plurality of leads include a plurality of specific leads arranged along the first connection bar;
the plurality of specific leads are each connected to the first connection bar;
at least one of the specific leads is connected to the second connection bar via the at least one support lead; and
a cross-sectional second-order moment of a first cross section of the at least one support lead perpendicular to the first direction, around an axis parallel to the second direction is equal to or more than a cross-sectional second-order moment of a second cross section of the at least one support lead perpendicular to the second direction, around an axis parallel to the first direction, the second cross section being substantially perpendicular to the first cross section.

2. The lead frame according to claim 1, wherein at least one of the specific leads is directly connected to the at least one support lead.

3. The lead frame according to claim 1, wherein the at least one support lead is directly connected to the second connection bar.

4. The lead frame according to claim 1, wherein at least a part of the at least one support lead is located away from the first connection bar.

5. The lead frame according to claim 1, wherein:
the at least one support lead includes one support lead; and
the plurality of specific leads are connected to the one support lead.

6. The lead frame according to claim 5, further comprising a connecting lead configured to connect the one support lead and the second connection bar.

7. The lead frame according to claim 5, wherein the one support lead is located in a region that is to be removed in a manufacturing process of the electronic component.

8. The lead frame according to claim 1, wherein:
the at least one support lead includes a plurality of support leads; and
each of the specific leads is connected to the second connection bar via a corresponding one of the support leads.

9. The lead frame according to claim 1, wherein:
the at least one support lead has a first dimension in the first direction and a second dimension in the second direction; and
the second dimension is equal to or more than the first dimension.

10. The lead frame according to claim 1, wherein a shape of the at least one support lead, when viewed from a third direction orthogonal to the first and second directions, is an n-sided polygon where n is 4 or more, a circle, or an ellipse.

11. An electronic component manufactured using the lead frame according to claim 1, the electronic component comprising:
a chip mounted on the die pad; and
an encapsulating resin that encapsulates the die pad, the plurality of leads, and the chip, wherein each of the leads has an exposed surface that is not covered with the encapsulating resin.

12. The electronic component according to claim 11, further comprising a plating layer configured to cover the exposed surface.

* * * * *